United States Patent
Fujiwara et al.

(10) Patent No.: US 11,935,586 B2
(45) Date of Patent: Mar. 19, 2024

(54) MEMORY DEVICE AND METHOD FOR COMPUTING-IN-MEMORY (CIM)

(71) Applicant: TAIWAN SEMICONDUCTOR MANUFACTURING COMPANY, LTD., Hsinchu (TW)

(72) Inventors: Hidehiro Fujiwara, Hsinchu (TW); Haruki Mori, Hsinchu (TW); Wei-Chang Zhao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/670,384

(22) Filed: Feb. 11, 2022

(65) Prior Publication Data

US 2023/0260569 A1    Aug. 17, 2023

(51) Int. Cl.
*G11C 11/417* (2006.01)
*G06F 7/544* (2006.01)
*G11C 11/412* (2006.01)

(52) U.S. Cl.
CPC .......... *G11C 11/417* (2013.01); *G06F 7/5443* (2013.01); *G11C 11/412* (2013.01)

(58) Field of Classification Search
CPC .............................. G11C 11/412; G11C 11/54
See application file for complete search history.

(56) References Cited

U.S. PATENT DOCUMENTS

| | | | |
|---|---|---|---|
| 2022/0020406 A1* | 1/2022 | Song | G11C 7/1069 |
| 2022/0101085 A1* | 3/2022 | Garcia Redondo | G06N 3/048 |
| 2022/0414443 A1* | 12/2022 | Li | G06N 3/065 |
| 2022/0414444 A1* | 12/2022 | Li | G06N 3/065 |

* cited by examiner

*Primary Examiner* — Kretelia Graham
(74) *Attorney, Agent, or Firm* — Hauptman Ham, LLP

(57) ABSTRACT

A memory device has a memory array of a plurality of memory cells arranged in a plurality of columns and a plurality of rows. The memory cells in each of the plurality of columns include first memory cells and second memory cells alternately arranged along a column direction of the plurality of columns. A first computation circuit is coupled to the first memory cells in each of the plurality of columns, and is configured to generate first output data corresponding to a first computation performed on first weight data stored in the first memory cells. A second computation circuit is coupled to the second memory cells in each of the plurality of columns, and is configured to generate second output data corresponding to a second computation performed on second weight data stored in the second memory cells.

20 Claims, 9 Drawing Sheets

MEMORY DEVICE AND METHOD FOR COMPUTING-IN-MEMORY (CIM)

BACKGROUND

Recent developments in the field of artificial intelligence have resulted in various products and/or applications, including, but not limited to, speech recognition, image processing, machine learning, natural language processing, or the like. Such products and/or applications often use neural networks to process large amounts of data for learning, training, cognitive computing, or the like. Memory devices configured to perform computing-in-memory (CIM) operations (also referred to herein as CIM memory devices) are usable neural network applications, as well as other applications. A CIM memory device includes a memory array configured to store weight data to be used, together with input data, in one or more CIM operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
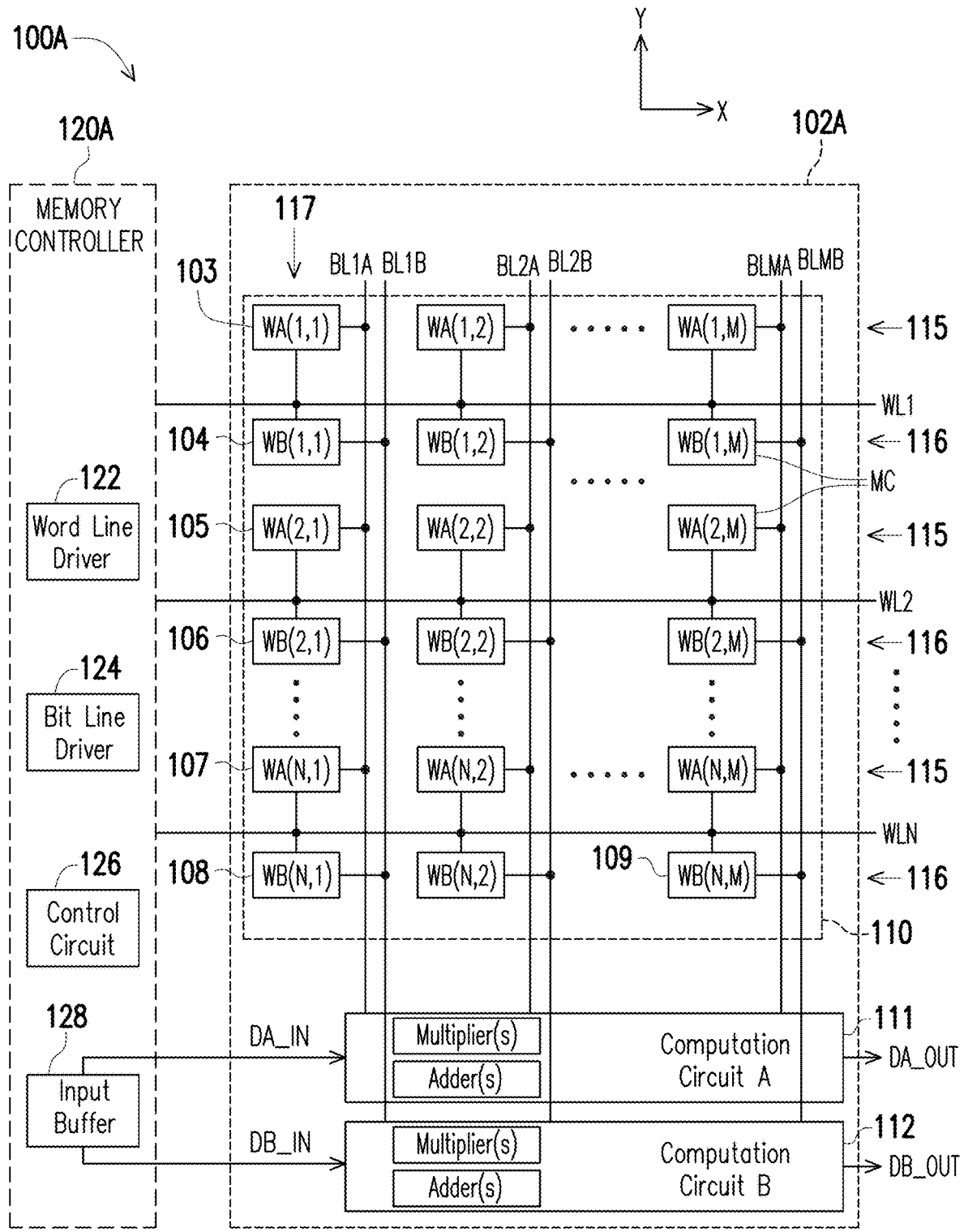
FIGS. 1A-1C are schematic diagrams of various memory devices, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments, a memory array comprises memory cells arranged in a plurality of rows and columns. The memory cells in the memory array are divided into two or more memory cell groups. Memory cells of different memory cell groups are alternately arranged along each column in the memory array, and are coupled to different, corresponding computation circuits. As a result, in one or more embodiments, a processing or computing workload of each of the computation circuits is reduced compared to when all memory cells in each column are coupled to the same computation circuit. In at least one embodiment, the reduced computing workload of each computation circuit improves the accuracy of computations performed by the computation circuit, especially in CIM operations. In at least one embodiment, a row of memory cells of one memory cell group and at least one row of memory cells of at least one different memory cell group are coupled to the same, common word line. As a result, in one or more embodiments, it is possible to simultaneously access multiple rows of memory cells using the common word line. In at least one embodiment, such simultaneous multiple row access improves the efficiency of a memory macro that contains the memory array, especially in CIM operations. In some embodiments, front-end-of-line (FEOL) and/or middle-end-of-line (MEOL) process loading of the memory macro is advantageously decreased. In some embodiments, the described memory device configuration is applicable to both analog and digital CIM operations.

FIG. 1A is a schematic diagram of a memory device 100A, in accordance with some embodiments. A memory device is a type of an integrated circuit (IC) device. In at least one embodiment, a memory device is an individual IC device. In some embodiments, a memory device is included as a part of a larger IC device which comprises circuitry other than the memory device for other functionalities.

The memory device 100A comprises a memory macro 102A and a memory controller 120A. The memory macro 102A comprises a memory array 110 of memory cells MC, and a plurality of computation circuits. In the example configuration in FIG. 1A, the memory device 100A comprises two computation circuits 111, 112. Other numbers of computation circuits are within the scopes of various embodiments. The memory controller 120A comprises a word line driver 122, a bit line driver 124, a control circuit 126, and an input buffer 128. In some embodiments, one or more elements of the memory controller 120A are included in the memory macro 102A, and/or one or more elements (except the memory array 110) of the memory macro 102A are included in the memory controller 120A.

A macro has a reusable configuration and is usable in various types or designs of IC devices. In some embodiments, the macro is understood in the context of an analogy to the architectural hierarchy of modular programming in which subroutines/procedures are called by a main program (or by other subroutines) to carry out a given computational function. In this context, an IC device uses the macro to perform one or more given functions. Accordingly, in this context and in terms of architectural hierarchy, the IC device is analogous to the main program and the macro is analogous to subroutines/procedures. In some embodiments, the macro is a soft macro. In some embodiments, the macro is a hard macro. In some embodiments, the macro is a soft macro which is described digitally in register-transfer level (RTL) code. In some embodiments, synthesis, placement and routing have yet to have been performed on the macro such that the soft macro can be synthesized, placed and routed for a variety of process nodes. In some embodiments, the macro is a hard macro which is described digitally in a binary file format (e.g., Graphic Database System II (GDSII) stream format), where the binary file format represents planar geometric shapes, text labels, other information and the like of one or more layout-diagrams of the macro in hierarchical form. In some embodiments, synthesis, placement and routing have been performed on the macro such that the hard macro is specific to a particular process node.

A memory macro is a macro comprising memory cells which are addressable to permit data to be written to or read from the memory cells. In some embodiments, a memory macro further comprises circuitry configured to provide access to the memory cells and/or to perform a further function associated with the memory cells. For example, one or more weight buffers (not shown), one or more logic circuits (not shown) and the computation circuits 111, 112 form circuitry configured to provide a CIM function associated with the memory cells MC in the memory macro 102A. In at least one embodiment, a memory macro configured to provide a CIM function is referred to as a CIM macro. The described macro configuration is an example. Other configurations are within the scopes of various embodiments.

The memory cells MC are arranged in a plurality of columns and rows of the memory array 110. The memory controller 120A is electrically coupled to the memory cells MC and configured to control operations of the memory cells MC including, but not limited to, a read operation, a write operation, or the like.

The memory array 110 further comprises a plurality of word lines (also referred to as "address lines") WL1 to WLN extending along a row direction (i.e., the X direction) of the rows, and a plurality of bit lines (also referred to as "data lines") BL1A, BL1B, BL2A, BL2B, to BLMA, BLMB extending along a column direction (i.e., the Y direction) of the columns, where N and M are natural numbers. The word lines are commonly referred to herein as WL, and the bit lines are commonly referred to herein as BL. Each of the memory cells MC is electrically coupled to the memory controller 120A by at least one of the word lines, and at least one of the bit lines. In some example operations, word lines are configured for transmitting addresses of the memory cells MC to be read from, or for transmitting addresses of the memory cells MC to be written to, or the like. In at least one embodiment, a set of word lines is configured to perform as both read word lines and write word lines. In an example, the word lines WL1 to WLN are configured as both read word lines and write word lines. In a further example, the word lines WL1 to WLN are configured as read word lines, and the memory array 110 further comprises a separate set of write word lines (not shown). Examples of bit lines include read bit lines for transmitting data read from the memory cells MC indicated by corresponding word lines, write bit lines for transmitting data to be written to the memory cells MC indicated by corresponding word lines, or the like. In at least one embodiment, a set of bit lines is configured to perform as both read bit lines and write bit lines. In an example, the bit lines BL1A, BL1B, BL2A, BL2B, to BLMA, BLMB are configured as both read word lines and write word lines. In a further example, the bit lines BL1A, BL1B, BL2A, BL2B, to BLMA, BLMB are configured as read bit lines, and the memory array 110 further comprises a separate set of write bit lines (not shown). In some embodiments, the memory array 110 further comprises a plurality of source lines (not shown) coupled to the memory cells MC along the rows or along the columns. Various numbers of word lines and/or bit lines and/or source lines in the memory array 110 are within the scope of various embodiments. Example memory types of the memory cells MC include, but are not limited to, static random-access memory (SRAM), resistive RAM (RRAM), magnetoresistive RAM (MRAM), phase change RAM (PCRAM), spin transfer torque RAM (STTRAM), floating-gate metal-oxide-semiconductor field-effect transistors (FGMOS), spintronics, or the like. In one or more example embodiments described herein, the memory cells MC include SRAM memory cells.

In the example configuration in FIG. 1A, the memory cells MC are single-port memory cells. In some embodiments, the memory cells MC are multi-port memory cells. In some embodiments, a port of a memory cell is represented by a set of a word line WL and a bit line BL (referred to herein as a WL/BL set) which are configured to provide access to the memory cell in a read operation (i.e., read access) and/or in a write operation (i.e., write access). A single-port memory cell has one WL/BL set which is configured for both read access and write access, but not at the same time. A multi-port memory cell has several WL/BL sets each of which is configured for read access only, or for write access only, or for both read access and write access.

Each of the memory cells MC is configured to store a piece of weight data to be used in a CIM operation. In one or more example embodiments described herein, the memory cells MC are single-bit memory cells, i.e., each memory cell is configured to store a bit of weight data. This is an example, and multi-bit memory cells, each of which is configured to store more than one bit of weight data, are within the scopes of various embodiments. In some embodiments, a single-bit memory cell is also referred to as a bitcell. For example, the memory cell 103 coupled to the word line WL1 and the bit line BL1A is configured to store a piece WA(1,1) of the weight data. A combination of multiple pieces of weight data stored in multiple memory cells constitutes a weight value to be used in a CIM operation. For simplicity, a piece of weight data stored in a memory cell MC, multiple pieces of weight data stored in multiple memory cells MC, or all pieces of weight data stored in all memory cells MC of the memory array 110 are referred to herein as weight data. For simplicity, the weight data are also used herein to refer to the corresponding memory cells. For example, a memory cell 103 is referred to by the corresponding piece of weight data WA(1,1), or a memory cell 109 is referred to by the corresponding piece of weight data WB(N,M).

In the example configuration in FIG. 1A, the memory cells MC in the memory array 110 are divided into two memory cell groups. It is within the scopes of various embodiments to divide the memory cells in an memory array into more than two memory cell groups. The two memory cell groups in the memory array 110 include a first memory cell group (also referred to as "group A"), and a second memory cell group (also referred to as "group B"). The first memory cell group, or group A, comprises first memory cells with corresponding weight data designated with label "WA." The second memory cell group, or group B, comprises second memory cells with corresponding weight data designated with label "WB." The memory cells in each of the memory cell groups are arranged in a number of rows, and the rows of one memory cell group are alternately arranged with the rows of the other memory cell group along the column direction. For example, the first memory cells of group A are arranged in rows 115, the second memory cells of group B are arranged in rows 116, and the rows 115 are alternately arranged with the rows 116 along the column direction.

Each of the word lines WL1 to WLN is coupled to one row of the first memory cells, and an adjacent row of the second memory cells. For example, the word line WL1 is coupled to first memory cells WA(1,1), WA(1,2), . . . WA(1,M) in one of the rows 115 of group A, and is also coupled to second memory cells WB(1,1), WB(1,2), . . . WB(1,M) in an adjacent row 116 of group B. As a result, in at least one embodiment, it is possible to access multiple rows of memory cells using one word line WL, which improves the efficiency of the memory macro 102A and/or memory array 110. Further, in one or more embodiments, manufacturing time, cost and/or complexity is/are reduced, because N word lines are sufficient to access 2N rows of memory cells (i.e., N rows of first memory cells and N rows of second memory cells).

In each column, the first memory cells and second memory cells are alternately arranged along the column direction. For example, the memory cells MC in a column 117, which is the left most column in the memory array 110, comprise first memory cells 103, 105, 107, and second memory cells 104, 106, 108 alternately arranged along the column direction. The first memory cells 103, 105, 107 are coupled to a first bit line BL1A which, in turn, is coupled to the first computation circuit 111. The second memory cells 104, 106, 108 are coupled to a second bit line BL1B which, in turn, is coupled to the second computation circuit 112. The other columns are similarly configured. As a result, the first bit lines BL1A, BL2A, . . . BLMA couple the first memory cells to the first computation circuit 111, and the second bit lines BL1B, BL2B, . . . BLMB couple the second memory cells to the second computation circuit 112.

The first computation circuit 111 (also designated in FIG. 1A as "computation circuit A") is coupled to the first memory cells in each of the columns of the memory array 110, is configured to generate first output data DA_OUT corresponding to a first computation performed on first weight data stored in the first memory cells of group A. Similarly, the second computation circuit 112 (also designated in FIG. 1A as "computation circuit B") coupled to the second memory cells in each of the columns of the memory array 110, and is configured to generate second output data DB_OUT corresponding to a second computation performed on second weight data stored in the second memory cells of group B.

In some embodiments, the first computation is performed by the first computation circuit 111 in a CIM operation based on corresponding first input data DA_IN and the weight data stored in one or more of the first memory cells of group A. In some embodiments, the second computation is performed by the second computation circuit 112 in a CIM operation based on corresponding second input data DB_IN and the weight data stored in one or more of the second memory cells of group B. Examples of CIM operations include, but are not limited to, mathematical operations, logical operations, combination thereof, or the like. In at least one embodiment, at least one of the computation circuits 111, 112 comprises a Multiply Accumulate (MAC) circuit, and the CIM operation comprises a multiplication of one or more multibit weight values represented by the corresponding weight data with one or more multibit input data values represented by the corresponding input data. Further computation circuits configured to perform other computations, or to perform CIM operations other than a multiplication are within the scopes of various embodiments. In some embodiments, at least one of the output data DA_OUT, DB_OUT are supplied, as input data, to another memory macro (not shown) of the memory device 100A. In one or more embodiments, at least one of the output data DA_OUT, DB_OUT are output, through one or more I/O circuits (not shown) of the memory controller 120A, to external circuitry outside the memory device 100A, for example, a processor as described herein.

In some embodiments, a computation circuit comprises a digital MAC circuit. In one or more embodiments, a computation circuit comprises an analog MAC circuit. A digital MAC circuit is configured to receive and process digital signals. An analog MAC circuit is configured to receive and process analog signals. An example of a digital MAC circuit is described with respect to FIG. 1A. An example of analog MAC circuit is described with respect to FIG. 1B.

In FIG. 1A, each of the computation circuits 111, 112 comprises a digital MAC circuit having one or more multipliers and one or more adders. Each of the multipliers and adders comprises a logic circuit configured to perform a corresponding multiplication or addition operation. Example multipliers include, but are not limited to, NOR gates, AND gates, any other logic gates, combinations of logic gates, or the like. Example adders include, but are not limited to, full adders, half adders, or the like. In some embodiments, the adders in each digital MAC circuit are coupled to each other to form an adder tree having multiple stages. The described digital MAC circuit configuration having multipliers and adders is an example. Other digital MAC circuit configurations are within the scopes of various embodiments.

In some embodiments, one or more weight buffers (not shown) are coupled to the memory array 110 and configured to temporarily hold new weight data to be updated in the memory array 110. The weight buffers are coupled to the memory cells MC in the memory array 110 via bit lines. In one or more embodiments, the weight buffers are coupled to the memory cells MC in the memory array 110 via the bit lines BL1A, BL1B, BL2A, BL2B, to BLMA, BLMB when the bit lines are configured as both read bit lines and write bit lines. In at least one embodiment, the weight buffers are coupled to the memory cells MC in the memory array 110 via a separate set of write bit lines (not shown). In a weight data updating operation, the new weight data are written into one or more memory cells MC from the weight buffers and via the corresponding bit lines. In some embodiments, the weight buffers are coupled to the memory controller 120A to receive the new weight data and/or control signals that specify when and/or in which memory cells MC the new weight data are to be updated. In at least one embodiment, the new weight data are received from external circuitry outside the memory device 100A, for example, a processor as described herein. The new weight data are received through one or more input/output (I/O) circuits (not shown) of the memory controller 120A and are forwarded to the weight buffers. Example weight buffers include, but are not limited to, registers, memory cells, or other circuit elements configured for data storage.

In the example configuration in FIG. 1A, the controller 120A comprises the word line driver 122, the bit line driver 124, the control circuit 126, and the input buffer 128. In at least one embodiment, the controller 120A further includes one or more clock generators for providing clock signals for various components of the memory device 100A, one or more input/output (I/O) circuits for data exchange with external devices, and/or one or more controllers for controlling various operations in the memory device 100A.

The word line driver 122 is coupled to the memory array 110 via the word lines WL. The word line driver 122 is configured to decode a row address of the memory cell MC selected to be accessed in a read operation or a write operation. The word line driver 122 is configured to supply a voltage to the selected word line WL corresponding to the decoded row address, and a different voltage to the other, unselected word lines WL.

The bit line driver 124 is coupled to the memory array 110 via the bit lines BL. The bit line driver 124 is configured to decode a column address of the memory cell MC selected to be accessed in a read operation or a write operation. The bit line driver 124 is configured to supply a voltage to the selected bit line BL corresponding to the decoded column address, and a different voltage to the other, unselected bit lines BL. In some embodiments, the memory controller 120A further comprises a source line driver (not shown) coupled to the memory cells MC via source lines (not shown).

The control circuit 126 is coupled to one or more of the weight buffers, computation circuits 111, 112, word line driver 122, bit line driver 124, input buffer 128 to coordinate operations of these circuits, drivers and/or buffers in the overall operation of the memory device 100A. For example, the control circuit 126 is configured to generate various control signals for controlling operations of one or more of the weight buffers, computation circuits 111, 112, word line driver 122, bit line driver 124, input buffer 128, or the like.

The input buffer 128 is configured to receive the input data from external circuitry outside the memory device 100A, for example, a processor as described herein. The input data are received through one or more I/O circuits (not shown) of the memory controller 120A and are forwarded via the input buffer 128 to the memory macro 102A. Example input buffers include, but are not limited to, registers, memory cells, or other circuit elements configured for data storage.

In an example CIM operation performed by the memory array 110A, the word lines WL1 to WLN are sequentially accessed in a read operation. Each time a word line WL is accessed, weight data stored in two rows of memory cells are read out. For example, when the word line WL1 is accessed, e.g., by a read voltage applied by the word line driver 122 on the word line WL1, first weight data are read out from first memory cells WA(1,1), WA(1,2), ... WA(1,M) in the corresponding row 115 of group A and, simultaneously, second weight data are read out from second memory cells WB(1,1), WB(1,2), ... WB(1,M) in the adjacent, corresponding row 116 of group B. The first weight data being read out are digital data and are supplied along the corresponding first bit lines BL1A, BL2A, ... BLMA to the first computation circuit 111. The second weight data being read out are digital data and are supplied along the corresponding second bit lines BL1B, BL2B, ... BLMB to the second computation circuit 112. In a next cycle, the word line WL2 is accessed, and further first weight data are read out from first memory cells WA(2,1), WA(2,2), ... WA(2,M) and supplied along the corresponding first bit lines BL1A, BL2A, ... BLMA to the first computation circuit 111. Simultaneously, further second weight data are read out from second memory cells WB(2,1), WB(2,2), ... WB(2,M) and supplied along the corresponding second bit lines BL1B, BL2B, ... BLMB to the second computation circuit 112, and so on.

In a first CIM operation at the first computation circuit 111, the first weight data sequentially read out from the first memory cells of group A are combined, e.g., multiplied, with the corresponding first input data DA_IN, which are digital signals, supplied from the input buffer 128 of the memory controller 120A. For example, the first weight data are multiplied with the corresponding first input data DA_IN by the corresponding multipliers and adders of the first computation circuit 111, to obtain and output the first output data DA_OUT. Similarly, in a second CIM operation at the second computation circuit 112, the second weight data sequentially read out from the second memory cells of group B are combined, e.g., multiplied, with the corresponding second input data DB_IN supplied from the input buffer 128 of the memory controller 120A, to obtain and output the second output data DB_OUT. In at least one embodiment, the first CIM operation is performed at the first computation circuit 111 simultaneously with the second CIM operation at the second computation circuit 112. In one or more embodiments, the input data DA_IN, DB_IN are output data supplied from another memory macro (not shown) of the memory device 100A. In some embodiments, each of the input data DA_IN, DB_IN is serially supplied to the corresponding computation circuit 111, 112 in the form of a stream of bits.

In some embodiments, the first CIM operation performed by the first computation circuit 111 using the first weight data read out from the first memory cells of group A is independent from the second CIM operation performed by the second computation circuit 112 using the second weight data read out, simultaneously with the first weight data, from the second memory cells of group B. As a result, the first and second output data DA_OUT, DB_OUT are processed separately or independently in further processing following the first and second CIM operations.

In some embodiments, the first CIM operation performed by the first computation circuit 111 and the second CIM operation performed by the second computation circuit 112 are related. For example, the first CIM operation and the second CIM operation are related parts of an overall CIM operation, and the first and second output data DA_OUT, DB_OUT are combined together in further processing following the first and second CIM operations.

Figure 1B:
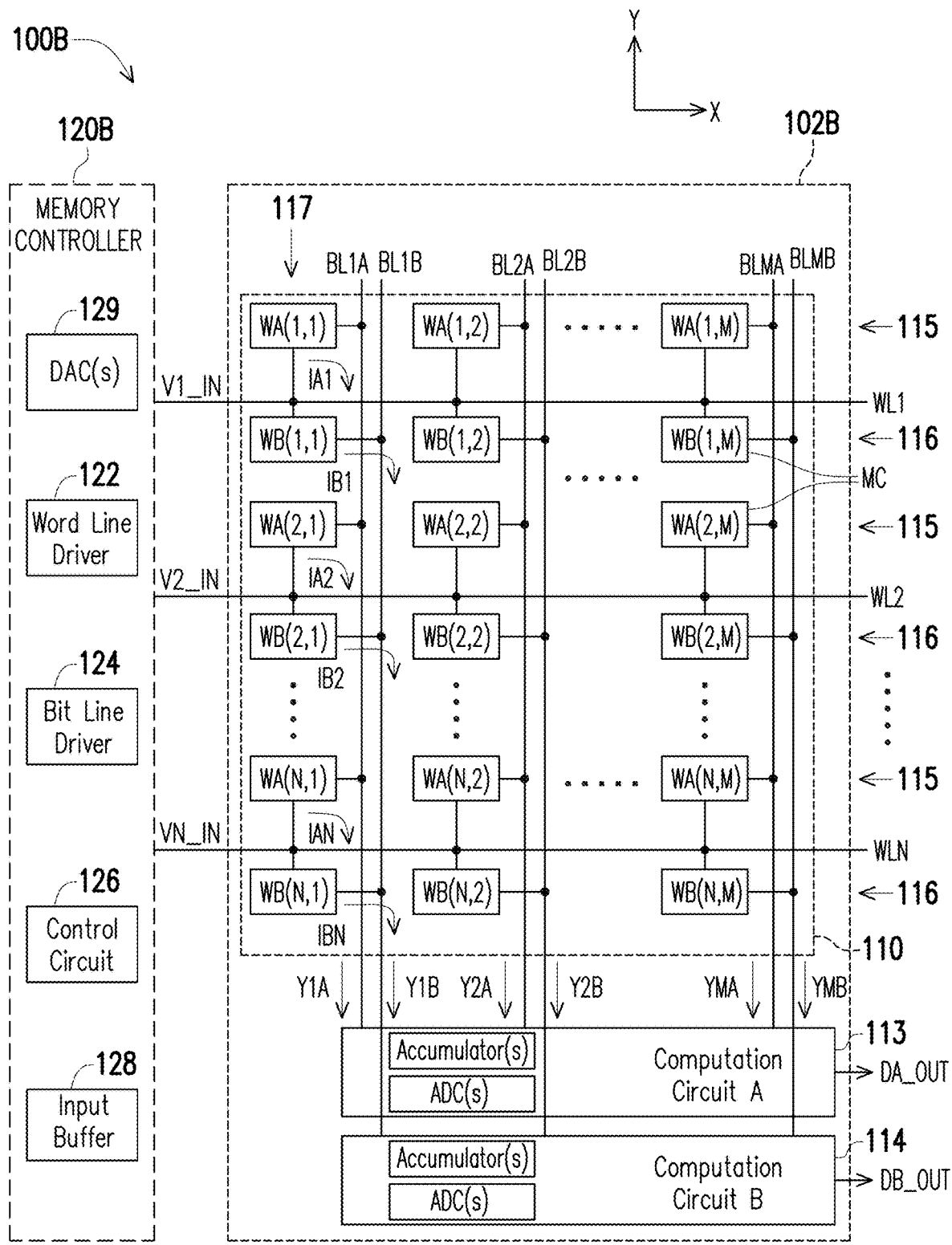

FIG. 1B is a schematic diagram of a memory device 100B, in accordance with some embodiments. Components in FIG. 1B having corresponding components in FIG. 1A are designated by the same reference numerals as in FIG. 1A.

A difference between the memory macro 102A in the memory device 100A and a corresponding memory macro 102B in the memory device 100B is that the computation circuits 111, 112 in the memory macro 102A comprise digital MAC circuits, whereas corresponding computation circuits 113, 114 in the memory macro 102B comprise analog MAC circuits. In FIG. 1B, each of the computation circuits 113, 114 comprises an analog MAC circuit having one or more accumulators and one or more analog-to-digital converters (ADCs). Example accumulators include, but are not limited to, resistors, capacitors, integrator circuits, operational amplifiers, combinations thereof, or the like. Example ADCs include, but are not limited to, logics, integrated circuits, comparators, counters, registers, combinations thereof, or the like. The described analog MAC circuit configuration having accumulators and ADCs is an example. Other analog MAC circuit configurations are within the scopes of various embodiments.

A further difference between the memory device 100A and the memory device 100B is that analog signals are input into the memory array 110, and further analog signals output from the memory array 110 are input into the analog MAC circuits at the computation circuits 113, 114. In the example configuration in FIG. 1B, the memory device 100B comprises a memory controller 120B corresponding to the memory controller 120A and further including one or more digital-to-analog converters (DACs) 129. The DACs 129 are configured to convert digital input data received through one or more I/O circuits (not shown) of the memory controller 120B into analog input signals for the memory array 110. For example, the analog input signals for the memory array 110 comprise various input voltage signals V1_IN, V2_IN to VN_IN supplied to the corresponding word lines WL1, WL2 to WLN. The input voltage signals V1_IN, V2_IN to VN_IN vary in one or more of amplitude, pulse duration, or the like, and correspond to the digital input data to be applied to each row of memory cells in the memory array 110. The application of input voltage signals to the memory array 110 via the word lines WL1 to WLN is an example. In some embodiments, input voltage signals are supplied to the memory array 110 via source lines (not shown).

In an example CIM operation performed by the memory array 110 in the memory device 100B, the word lines WL1 to WLN are simultaneously accessed in a read operation. The input voltage signals V1_IN, V2_IN to VN_IN are simultaneously applied by the memory controller 120B to the word lines WL1 to WLN, and cause corresponding currents to flow, through the memory cells MC of the memory array 110, to the bit lines BL1A, BL2A, ... BLMA and BL1B, BL2B, ... BLMB. For example, as illustrated for the column 117 in FIG. 1B, the input voltage signal V1_IN on the word line WL1 causes a current IA1 corresponding to the weight datum or weight data in the memory cell WA(1,1) to flow to the bit line BL1A. The input voltage signal V1_IN on the word line WL1 also causes a current IB1 corresponding to the weight datum or weight data in the memory cell WB(1,1) to flow to the bit line BL1B. Similarly, currents IA2 to IAN corresponding to weight data in the other first memory cells in the column 117 are caused by the corresponding input voltage signals V2_IN to VN_IN to flow to the bit line BL1A, and currents IB2 to IBN corresponding to weight data in the other second memory cells in the column 117 are caused by the corresponding input voltage signals V2_IN to VN_IN to flow to the bit line BL1B. The sum of the currents IA1 to IAN on the bit line BL1A is a current Y1A supplied to the first computation circuit 113, and the sum of the currents IB1 to IBN on the bit line BL1B is a current Y1B supplied to the second computation circuit 114. Similarly, the sums of currents on the other first bit lines BL2A to BLMA are currents Y2A to YMA supplied to the first computation circuit 113, and the sums of currents on the other second bit lines BL2B to BLMB are currents Y2B to YMB supplied to the second computation circuit 114.

At the first computation circuit 113, the currents Y1A to YMA, which are analog signals, are converted to corresponding voltages by the one or more accumulators of the first computation circuit 113. The converted voltages are then converted to digital signals by the one or more ADCs of the first computation circuit 113, and output as first output data DA_OUT corresponding to the weight data stored in the first memory cells of group A in the memory array 110. Similarly, at the second computation circuit 114, the currents Y1B to YMB, which are analog signals, are converted to corresponding voltages by the one or more accumulators of the second computation circuit 114. The converted voltages are then converted to digital signals by the one or more ADCs of the second computation circuit 114, and output as second output data DB_OUT corresponding to the weight data stored in the second memory cells of group B in the memory array 110. As a result, input data corresponding to the input voltage signals V1_IN, V2_IN to VN_IN are combined, e.g., multiplied, with the weight data of the first memory cells and second memory cells of the memory array 110, and correspondingly output as first output data DA_OUT and second output data DB_OUT by corresponding first and second CIM operations at the computation circuits 113, 114.

In some embodiments, when the input data corresponding to the voltage signals V1_IN, V2_IN to VN_IN are to be applied to the weight data of the first memory cells of group A, but not to the weight data of the second memory cells of group B, the second memory cells are disable (or unselected) or the corresponding sum currents Y2B to YMB are not processed or output by the second computation circuit 114. Similarly, when the input data corresponding to the voltage signals V1_IN, V2_IN to VN_IN are to be applied to the weight data of the second memory cells of group B, but not to the weight data of the first memory cells of group A, the first memory cells are disable (or unselected) or the corresponding sum currents Y2A to YMA are not processed or output by the first computation circuit 113. In other words, it is possible, in one or more embodiments, that a first CIM operation at the first computation circuit 113 and a second CIM operation at the second computation circuit 114 are independent from each other and are performed separately, rather than simultaneously. In some embodiments, the first and second output data DA_OUT, DB_OUT are processed separately or independently in further processing following the first and second CIM operations. In some embodiments, the first CIM operation and the second CIM operation are related parts of an overall CIM operation, and the first and second output data DA_OUT, DB_OUT are combined together in further processing following the first and second CIM operations.

In at least one embodiment, as described with respect to FIGS. 1A-1B, memory cells of different memory cell groups are alternately arranged along each column in the memory array 110, and are coupled to different, corresponding computation circuits 111, 112 (or 113, 114). As a result, in one or more embodiments, processing or computing workload of each of the computation circuits is reduced, e.g., by about 50% when there are two memory cell groups because each computation circuit and/or corresponding bit line is/are to handles about 50% of memory cells in each column. In at least one embodiment, when the memory cells in a memory array are divided into more than two memory cell groups, e.g., as described with respect to FIGS. 3A-3B, the computing workload of each computation circuit is reduced to a greater extent. In at least one embodiment, the reduced computing workload of each computation circuit improves the accuracy of computations performed by the computation circuit, especially in CIM operations. This is different from other approaches where all memory cells in each column are coupled to the same computation circuit. In the other approaches with an analog-based CIM macro, long bit lines with large numbers of memory cells cause the accuracy to be degraded. In the other approaches with a digital-based CIM macro, parallelism is degraded. Although using multi-port bitcells is a potential option for improvement, the area of the digital-based CIM macro becomes undesirably large. In the other approaches with multiple memory banks, the array efficiency becomes worse. Memory devices and/or memory macros in accordance with some embodiments make it possible to avoid one or more or all of the issues observed in the other approaches.

In at least one embodiment, a row of memory cells of one memory cell group and at least one row of memory cells of at least one different memory cell group are coupled to the same, common word line. For example, as described with respect to FIGS. 1A-1B, the word line WL1 is a common word line for a row 115 of first memory cells and an adjacent row 116 of second memory cells. As a result, in one or more embodiments, it is possible to simultaneously access multiple rows of memory cells using the common word line. In at least one embodiment, such simultaneous multiple row access improves the efficiency of a memory macro that contains the memory array, especially in CIM operations. In some embodiments, FEOL and/or MEOL process loading of the memory macro is advantageously decreased.

In at least one embodiment, CIM memory devices, such as the memory device 100A, 100B are advantageous over other approaches, where data are moved back and forth between the memory and a processor, because such back-and-forth data movement, which is a bottleneck to both performance and energy efficiency, is avoidable. Examples CIM applications include, but are not limited to, artificial intelligence, image recognition, neural network for machine learning, or the like.

Figure 1C:
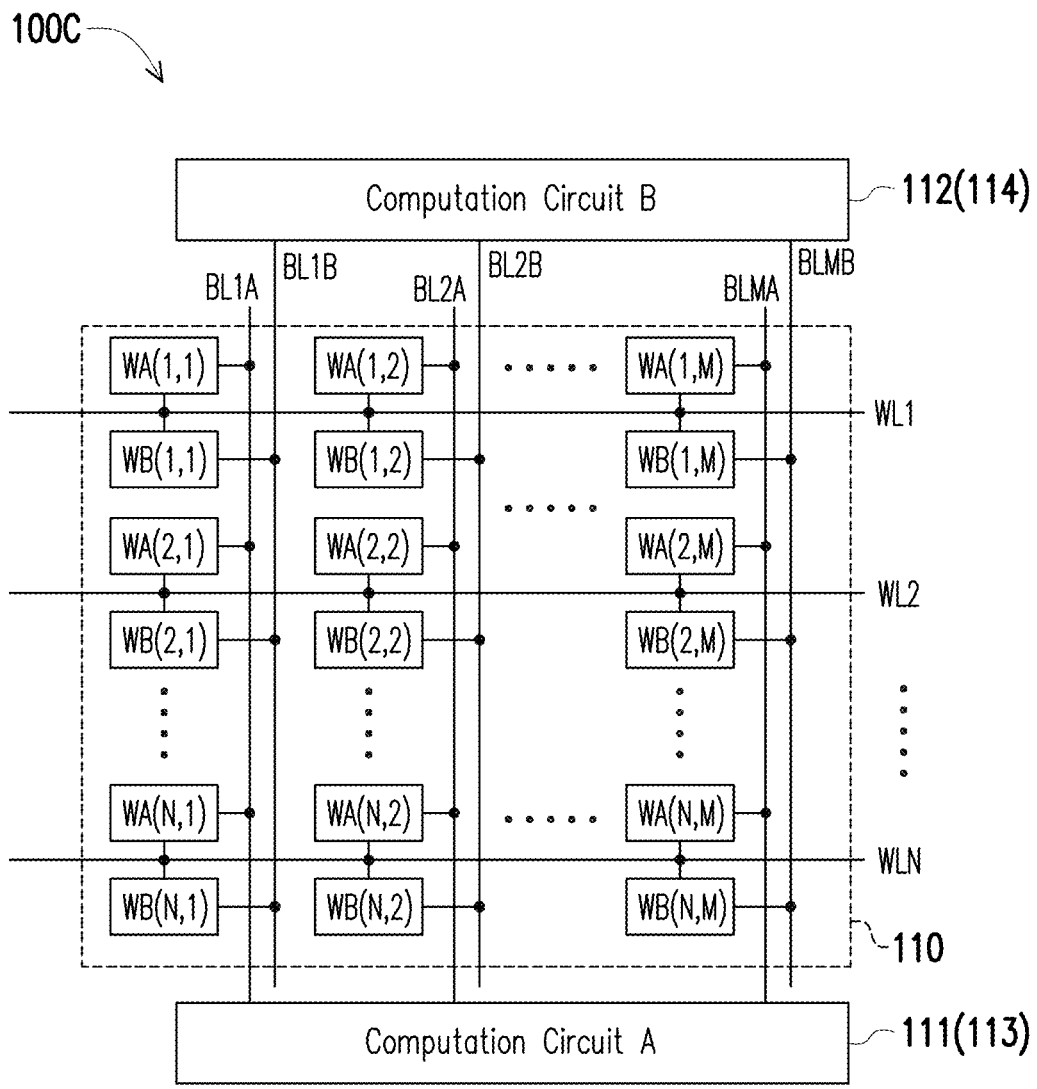

FIG. 1C is a schematic diagram of a memory device 100C, in accordance with some embodiments. Components in FIG. 1C having corresponding components in FIGS. 1A, 1B are designated by the same reference numerals as in FIGS. 1A, 1B.

A difference between the memory device 100C and the memory devices 100A, 100B involves physical arrangements of the computation circuits with respect to the corresponding memory array. In the example configurations in FIGS. 1A, 1B, the computation circuits 111, 112 (or 113, 114) are physically arranged at one side of the memory array 110. In the example configuration in FIG. 1C, the computation circuits 111, 112 (or 113, 114) are physically arranged at opposite sides of the memory array 110, along the column direction. The flexibility of locations of the computation circuits with respect to the memory array is advantageous in one or more embodiments. In at least one embodiment, one or more advantages described herein with respect to the memory devices 100A, 100B are achievable in the memory device 100C.

Figure 2:
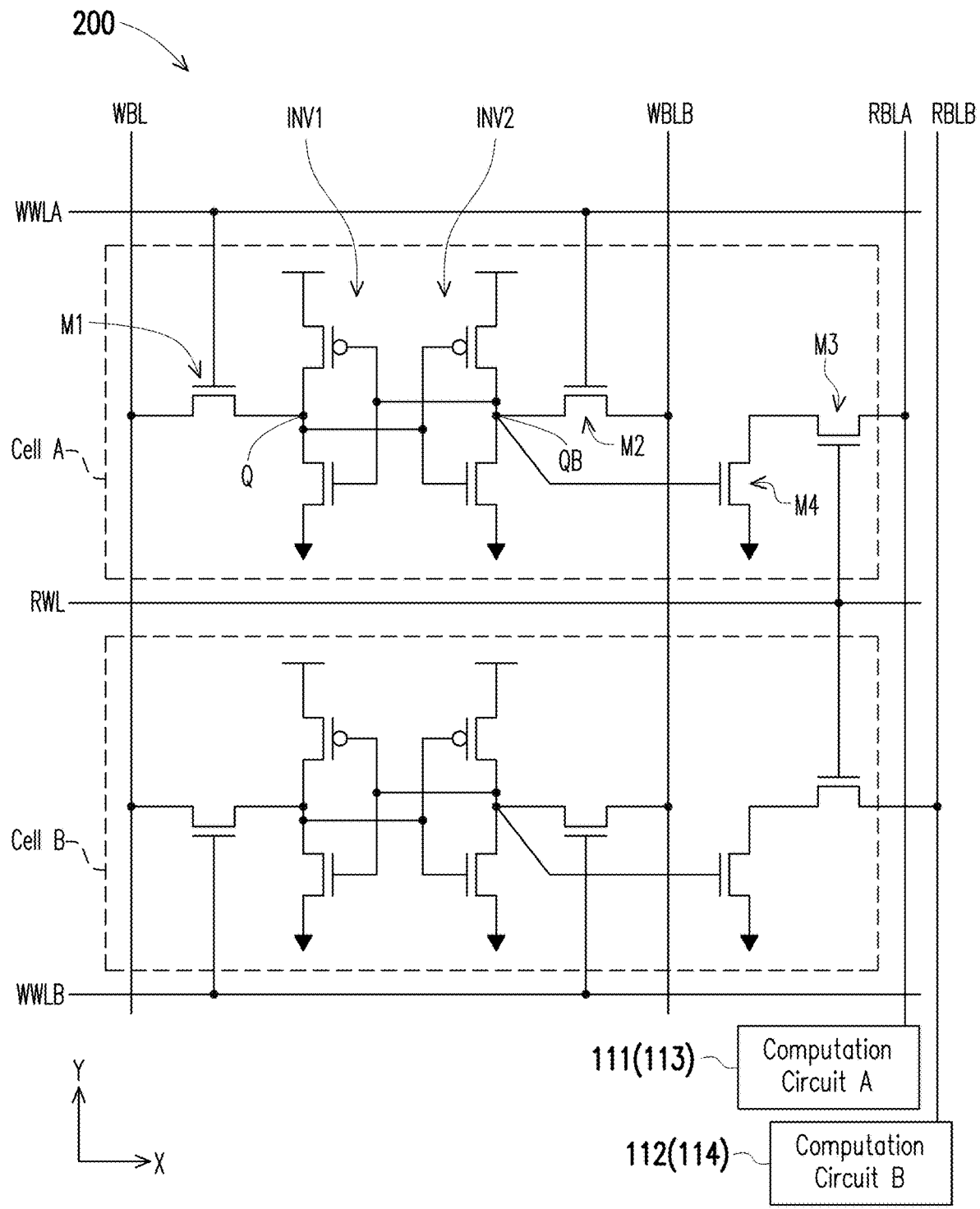
FIG. 2 is a schematic circuit diagram of a section of a memory macro, in accordance with some embodiments.

FIG. 2 is a schematic circuit diagram of a section of a memory macro 200, in accordance with some embodiments. In at least one embodiment, the memory macro 200 corresponds to one or more of the memory macros 102A, 102B.

The section of the memory macro 200 illustrated in FIG. 2 comprises two memory cells, i.e., cell A and cell B. In at least one embodiment, cell A corresponds to a first memory cell and cell B corresponds to a second memory cell in the same column of the memory array 110. For example, cell A corresponds to the first memory cell 103, cell B corresponds to the second memory cell 104 in the column 117 of the memory array 110. In the example configuration in FIG. 2, each of cell A and cell B comprises an 8-transistor (8T) SRAM cell. This is an example, and other memory cell configurations are within the scopes of various embodiments.

Cell A comprises transistors M1, M2, inverters INV1, INV2, and a read port comprising transistors M3, M4. Each of inverters INV1, INV2 comprises a pair of a p-type transistor and an n-type transistors (not numbered). An input of the inverter INV2 is coupled to an output of the inverter INV1 at a node Q. An output of the inverter INV2 is coupled to an input of the inverter INV1 at a node QB. Gates of the transistors M1, M2 are coupled to a write word line WWLA. The transistor M1 is serially coupled between the node Q and a write bit line WBL. The transistor M2 is serially coupled between the node QB and a complementary write bit line WBLB. The inverters INV1, INV2 form a storage circuit for storing a weight datum corresponding to a logic state (e.g., logical "0" or logical "1") of the node Q or QB. The transistors M1, M2 are access transistors configured to couple the storage circuit to the write bit lines WBL/WBLB for write access, in response to an appropriate voltage applied to the write word line WWLA. In the read port, the transistors M3, M4 are serially coupled between a read bit line RBLA and a reference voltage, such as the ground voltage. A gate of the transistor M3 is coupled to a read word line RWL. A gate of the transistor M4 is coupled to the node QB. Examples of the transistors in cell A include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like.

The configuration of cell B is similar to that of cell A, and a detailed description of cell B is omitted. Cell B is coupled to the same pair of write bit lines WBL, WBLB, and the same read word line RWL as cell A. Cell B is further coupled to a read bit line RBLB and a write word line WWLB. The read word line RWL and the read bit lines RBLA, RBLB correspond to the word line WL1 and the bit lines BL1A, BL1B in the memory array 110.

In a write operation, e.g., for updating the weight datum stored in cell A, an appropriate voltage is applied to the write word line WWLA, the transistors M1, M2 are turned ON, and a new weight datum is written through at least one of the write bit lines WBL, WBLB and is stored in the storage circuit formed by the inverters INV1, INV2. During write operation, the transistor M3 is turned OFF. A write operation of cell B is performed in a similar manner.

In a read operation, an appropriate voltage is applied to the read word line RWL which is common to both cell A and cell B, to turn on the transistor M3 of cell A and a corresponding transistor of cell B. A current corresponding to a conductance of the transistor M4 which, in turn, corresponds to the weight datum stored in cell A, is applied to the read bit line RBLA and then to the corresponding first computation circuit 111 (or 113). Simultaneously, a current corresponding to the weight datum stored in cell B is applied to the read bit line RBLB and then to the corresponding second computation circuit 112 (or 114). The computation circuits 111, 112 (or 113, 114) perform corresponding CIM operations based on the weight data of cell A and cell B, as described herein.

In some embodiments, the memory macro 200 has N read word lines, each of which is common, i.e., coupled, to one row of cells A and one row of cells B. The memory macro 200 comprises 2N rows of memory cells, and corresponding 2N write word lines each of one of the 2N rows of memory cells. In one or more embodiments, the first computation circuit 111 (or 113) and the second computation circuit 112 (or 114) in the memory macro 200 are physically arranged at opposite sides of the memory array 110, as described with respect to FIG. 1C. In at least one embodiment, one or more advantages described herein with respect to the memory devices 100A, 100B and/or memory macros 102A, 102B are achievable in the memory macro 200 and/or a memory device comprising the memory macro 200.

Figure 3A:
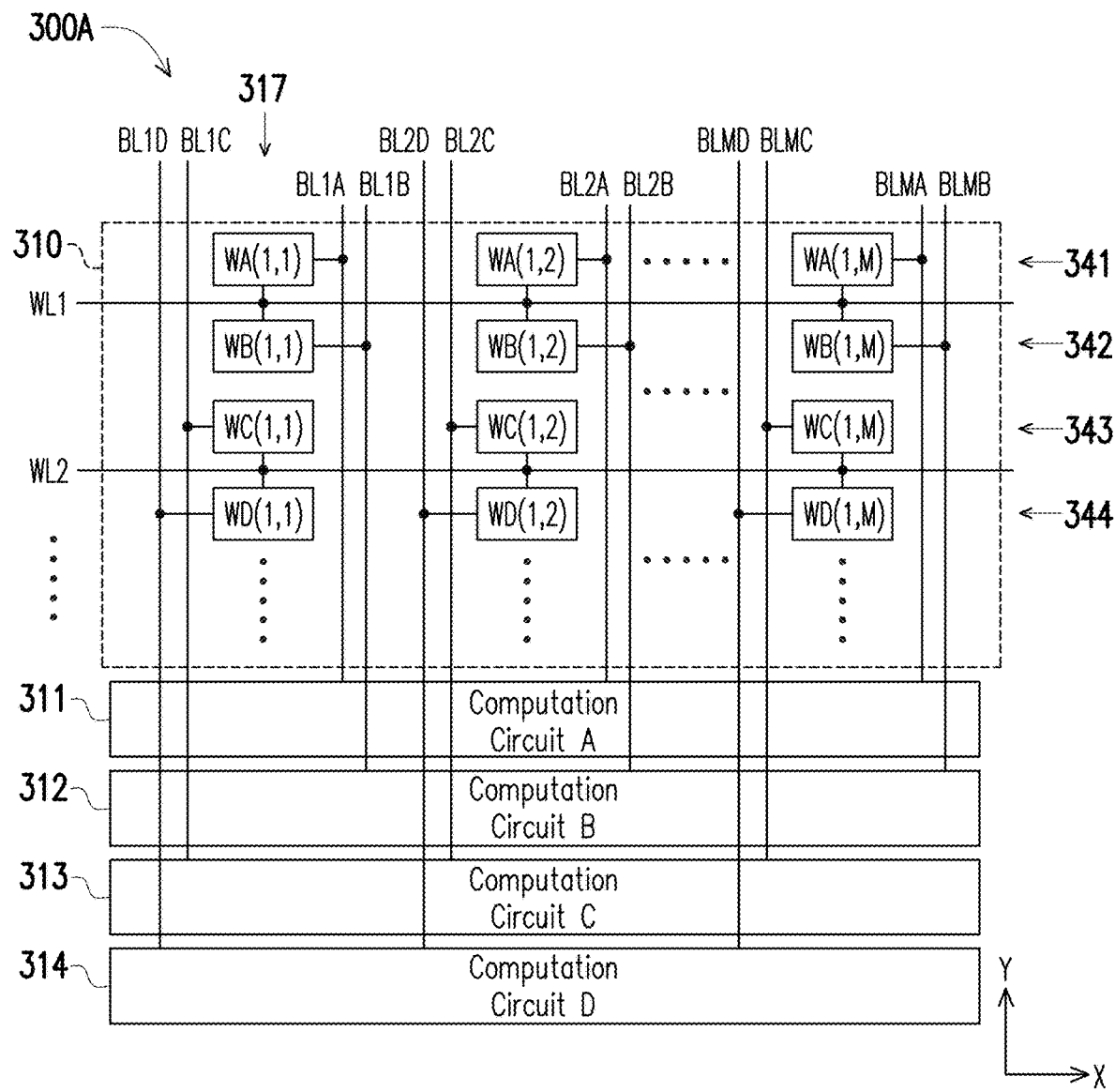
FIGS. 3A-3B are schematic diagrams of various memory macros, in accordance with some embodiments.

FIG. 3A is a schematic circuit diagram of a memory macro 300A, in accordance with some embodiments. In at least one embodiment, the memory macro 300A corresponds to one or more of the memory macros 102A, 102B, 200. Components in FIG. 3A having corresponding components in FIGS. 1A, 1B are designated by the same reference numerals as in FIGS. 1A, 1B.

A difference between the memory macro 300A and the memory macros 102A, 102B, 200 is the number of memory cell groups in the corresponding memory array. In the example configurations of the memory macros 102A, 102B, 200, there are two memory cell groups in the corresponding memory array. In the memory macro 300A, the memory cells in a memory array 310 are divided into four memory cell groups. The first memory cell group, or group A, comprises first memory cells with corresponding weight data designated with label "WA." The second memory cell group, or group B, comprises second memory cells with corresponding weight data designated with label "WB." The third memory cell group, or group C, comprises third memory cells with corresponding weight data designated with label "WC." The fourth memory cell group, or group D, comprises fourth memory cells with corresponding weight data designated with label "WD."

The memory cells in each of the memory cell groups are arranged in a number of rows, and the rows of one memory cell group are alternately arranged with the rows of the other memory cell group along the column direction. For example, the first memory cells of group A are arranged in rows 341, the second memory cells of group B are arranged in rows 342, the third memory cells of group C are arranged in rows 343, and the fourth memory cells of group D are arranged in rows 344. The rows 341, 342, 343, 344 are alternately arranged along the column direction. The set of rows 341, 342, 343, 344 illustrated in FIG. 3A is repeated along the column direction. For simplicity, one row 341, one row 342, one row 343, one row 344 are illustrated in FIG. 3A.

Each of word lines in the memory macro 300A is coupled to two adjacent rows of memory cells belonging to two different memory cell groups. For example, the word line WL1 is coupled to first memory cells in the row 341 of group A, and is also coupled to second memory cells in the adjacent row 342 of group B. The word line WL2 is coupled to third memory cells in the row 343 of group C, and is also coupled to fourth memory cells in the adjacent row 344 of group D. Thus, in a read operation or CIM operation, each of the word lines WL1, WL2 or the like permits access to two rows of memory cells.

In each column, the first through fourth memory cells are alternately arranged along the column direction, and are coupled by corresponding bit lines to corresponding computation circuits, in a manner similar to that described with respect to FIGS. 1A-1B. For example, in a column 317, the first memory cells are coupled to a first bit line BL1A which, in turn, is coupled to a first computation circuit 311. The second memory cells are coupled to a second bit line BL1B which, in turn, is coupled to a second computation circuit 312. The third memory cells are coupled to a third bit line BL1C which, in turn, is coupled to a third computation circuit 313. The fourth memory cells are coupled to a fourth bit line BL1D which, in turn, is coupled to a fourth computation circuit 314. The other columns are similarly configured. As a result, the first bit lines BL1A, BL2A, . . . BLMA couple the first memory cells to the first computation circuit 311, the second bit lines BL1B, BL2B, . . . BLMB couple the second memory cells to the second computation circuit 312, the third bit lines BL1C, BL2C, . . . BLMC couple the third memory cells to the third computation circuit 313, and the fourth bit lines BL1D, BL2D, . . . BLMD couple the fourth memory cells to the fourth computation circuit 314. The first through fourth computation circuits 311-314 are configured to correspondingly generate first through fourth output data corresponding to first through fourth computations performed on first through fourth weight data stored in the first through fourth memory cells. In some embodiments, the computation circuits 311-314 comprise digital MAC circuits as described with respect to FIG. 1A. In one or more embodiments, the computation circuits 311-314 comprise analog MAC circuits as described with respect to FIG. 1B.

In the example configuration in FIG. 3A, in each column, the first and second bit lines, e.g., BL1A, BL1B, are physically arranged at one side of the memory cells along the row direction, whereas the third and fourth bit lines, e.g., BL1C, BL1D, are physically arranged at the opposite side of the memory cells along the row direction. Other physical arrangements of the first through fourth bit lines with respect to the memory cells in each column are within the scopes of various embodiments. In the example configuration in FIG. 3A, the computation circuits 311-314 are physically arranged at one side of the memory array 310 along the column direction. In at least one embodiment, at least one of the computation circuits 311-314 is physically arranged at the opposite side of the memory array 310 along the column direction.

Figure 3B:
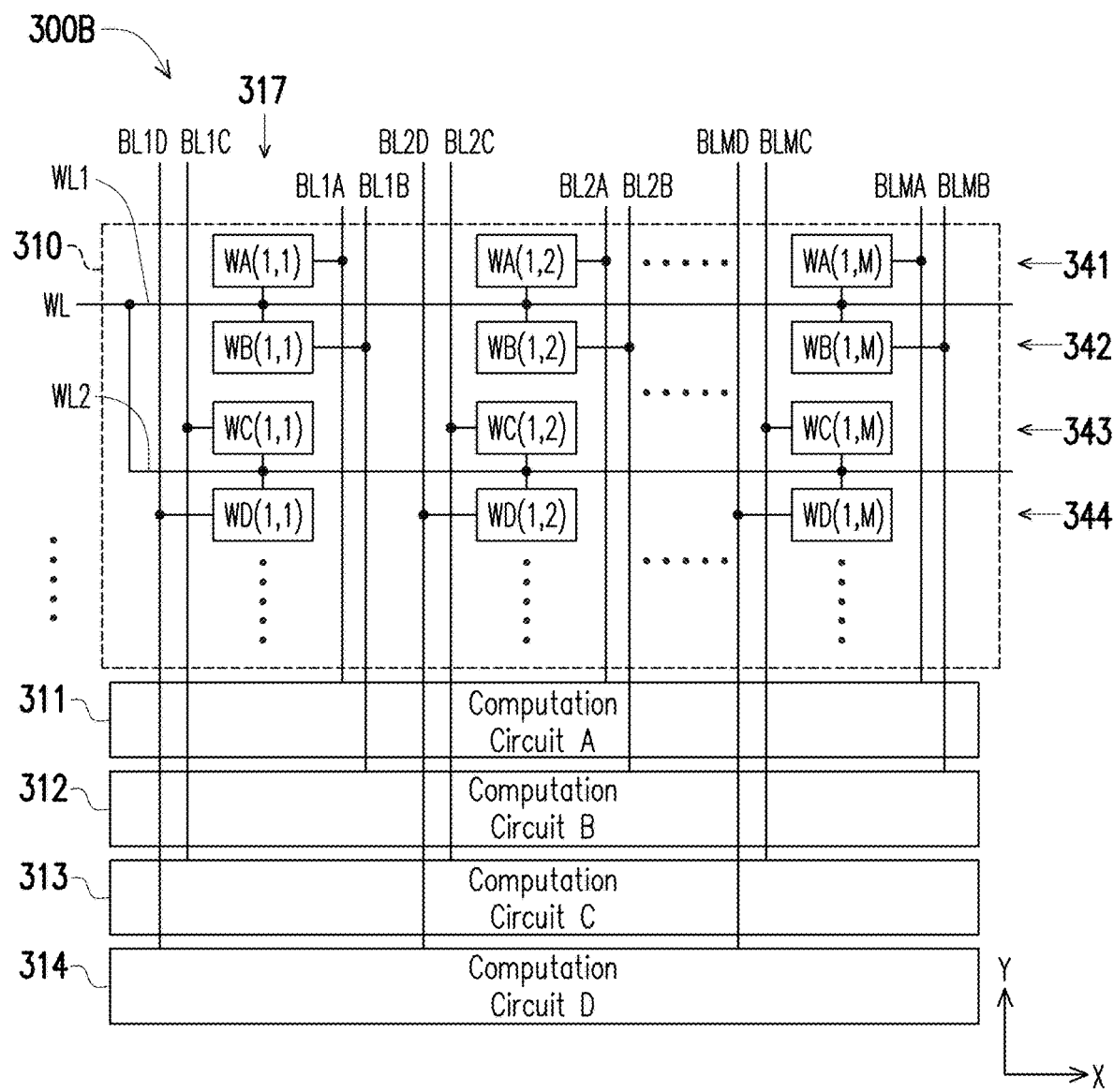

FIG. 3B is a schematic circuit diagram of a memory macro 300B, in accordance with some embodiments. In at least one embodiment, the memory macro 300B corresponds to one or more of the memory macros 102A, 102B, 200. Components in FIG. 3B having corresponding components in FIG. 3A are designated by the same reference numerals as in FIG. 3A.

A difference between the memory macro 300A and the memory macro 300B is that each word line WL in the memory macro 300B is configured to permit access to more than two rows of memory cells. For example, the word lines WL1, WL2 in the memory macro 300A are coupled together in the memory macro 300B. Physically, there are still two word lines WL1, WL2 along four rows 341-344 of memory cells in the memory macro 300B. However, operatively, the word lines WL1, WL2 are coupled together and are configured to function as a single word line WL that permits access to four rows 341-344 of memory cells simultaneously. In at least one embodiment, one or more advantages described herein with respect to the memory devices 100A, 100B and/or memory macros 102A, 102B, 200 are achievable in one or more of the memory macros 300A, 300B and/or a memory device comprising the memory macros 300A, 300B.

The described configurations in which memory cells of a memory array are divided in two or four groups are example. In some embodiments, the memory cells in a memory array comprise $2^K$ (2 to the power of K) memory cell groups, each of the $2^K$ memory cell groups comprises at least one row of memory cells, the rows of memory cells of the $2^K$ memory cell groups are alternately arranged along the column direction, the memory cells in each column are coupled by $2^K$ bit lines correspondingly to $2^K$ MAC circuits each coupled to the memory cells of a corresponding memory cell group among the $2^K$ memory cell groups, where K is a natural number. Each of the $2^K$ MAC circuits is configured to generate output data corresponding to a computation performed on the weight data stored in the memory cells of the corresponding memory cell group. One or more example configurations corresponding to K=1 are described with respect to FIGS. 1A-1C and 2. One or more example configurations corresponding to K=2 are described with respect to FIGS. 3A-3B. In at least one embodiment, one or more advantages described herein with respect to the memory devices 100A, 100B and/or memory macros 102A, 102B, 200, 300A, 300B are achievable for K greater than 2.

Figure 4:
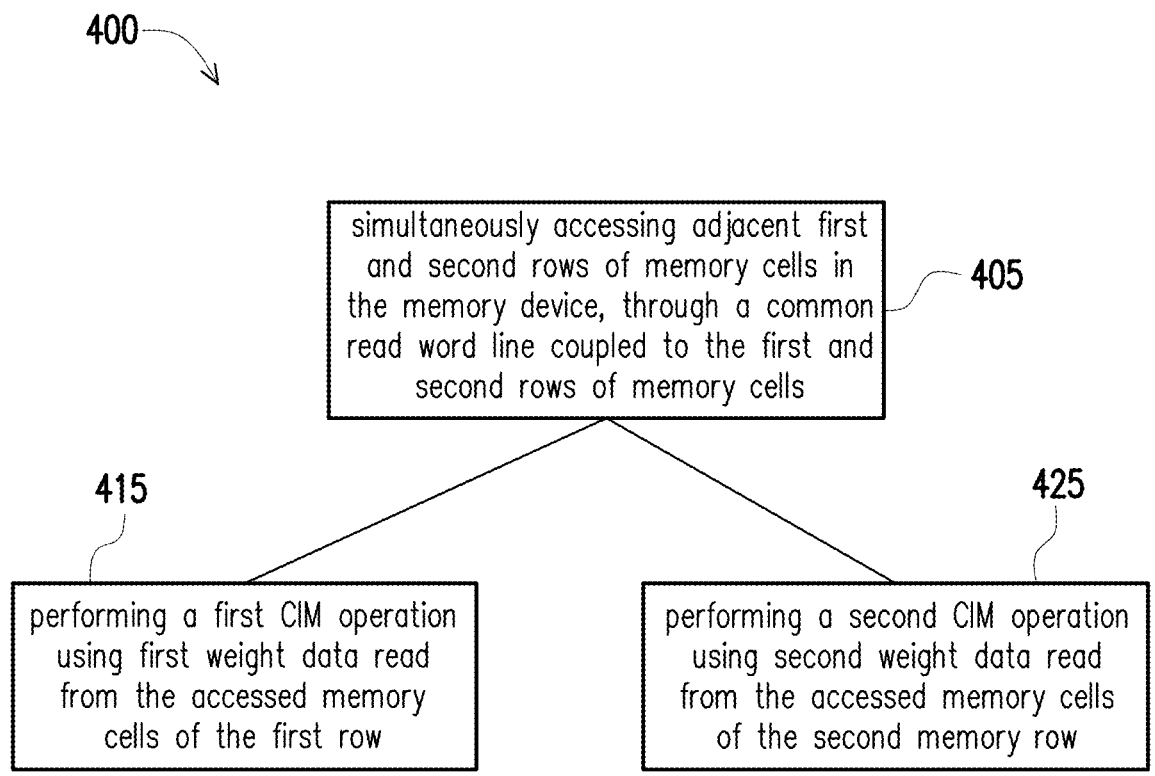
FIG. 4 is a flowchart of a method of operating a memory device, in accordance with some embodiments.

FIG. 4 is a flowchart of a method 400 of operating a memory device, in accordance with some embodiments. In at least one embodiment, the method 400 is performed in or by one or more ICs, memory devices, memory macros described herein. The method 400 comprises operations 405, 415, 425.

At operation 405, adjacent first and second rows of memory cells in the memory device are simultaneously accessed through a common read word line coupled to the first and second rows of memory cells. For example, as described with respect to FIG. 1A, a first row 115 of first memory cells and an adjacent second row 116 of second memory cells in the memory device are simultaneously accessed through a common read word line WL1 coupled to the first and second rows of memory cells. As a result, in at least one embodiment, it is possible to simultaneously read weight data from at least two rows of memory cells.

At operation 415, a first computing in memory (CIM) operation is performed using first weight data read from the accessed memory cells of the first row. For example, as described with respect to FIG. 1A, a first CIM operation is performed by a first computation circuit 111, using first weight data read from the accessed first memory cells of the first row 115.

At operation 425, a second CIM operation is performed using second weight data read from the accessed memory cells of the second row. For example, as described with respect to FIG. 1A, a second CIM operation is performed by a second computation circuit 112, using second weight data read from the accessed second memory cells of the second row 116.

In some embodiments, the first and second CIM operations are performed simultaneously by the corresponding first and second computation circuits, for example, as described with respect to FIG. 1A. In some embodiments, the first and second CIM operations are independent from each other, for example, as also described with respect to FIG. 1A. In at least one embodiment, one or more advantages described herein are achievable by the method 400.

The described methods and algorithms include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

Figure 5A:
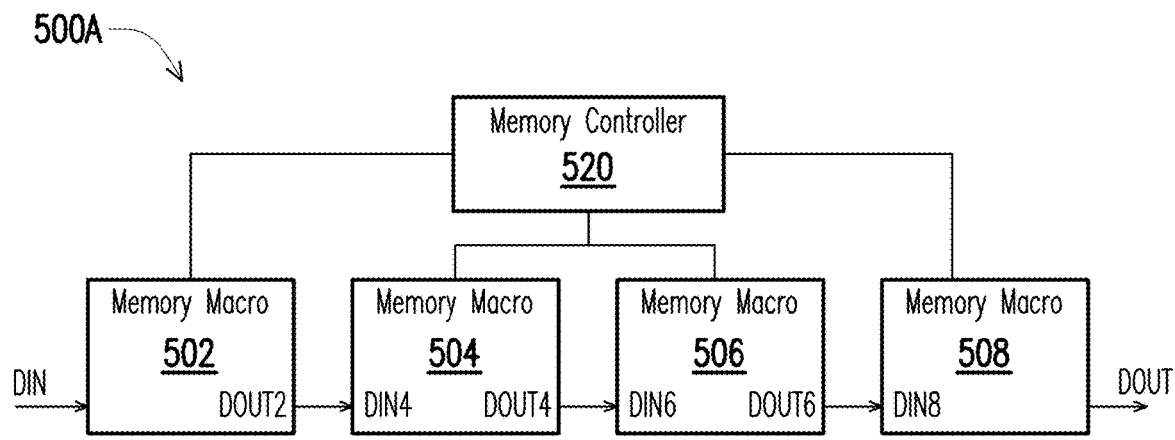
FIG. 5A is a schematic diagram of a memory device, in accordance with some embodiments.

FIG. 5A is a schematic diagram of a memory device 500A, in accordance with some embodiments.

The memory device 500A comprises memory macros 502, 504, 506, 508 and memory controller 520. In some embodiments, one or more of the memory macros 502, 504, 506, 508 correspond to one or more of the memory macros 102A, 102B, 200, 300A, 300B, and/or the memory controller 520 corresponds to the memory controller 120A, 120B. In the example configuration in FIG. 5A, the memory controller 520 is a common memory controller for the memory macros 502, 504, 506, 508. In at least one embodiment, at least one of the memory macros 502, 504, 506, 508 has its own memory controller. The number of four memory macros in the memory device 500A is an example. Other configurations are within the scopes of various embodiments.

The memory macros 502, 504, 506, 508 are coupled to each other in sequence, with output data of a preceding memory macro being input data for a subsequent memory macro. For example, input data DIN are input into the memory macro 502. The memory macro 502 performs one or more CIM operations based on the input data DIN and weight data stored in the memory macro 502, and generates output data DOUT2 as results of the CIM operations. The output data DOUT2 are supplied as input data DIN4 of the memory macro 504. The memory macro 504 performs one or more CIM operations based on the input data DIN4 and weight data stored in the memory macro 504, and generates output data DOUT4 as results of the CIM operations. The output data DOUT4 are supplied as input data DIN6 of the memory macro 506. The memory macro 506 performs one or more CIM operations based on the input data DIN6 and weight data stored in the memory macro 506, and generates output data DOUT6 as results of the CIM operations. The output data DOUT6 are supplied as input data DIN8 of the memory macro 508. The memory macro 508 performs one or more CIM operations based on the input data DIN8 and weight data stored in the memory macro 508, and generates output data DOUT as results of the CIM operations. One or more of the input data DIN, DIN4, DIN6, DIN8 correspond to the input data described with respect to FIGS. 1A-1B, and/or one or more of the output data DOUT2, DOUT4, DOUT6, DOUT correspond to the output data described with respect to FIGS. 1A-1B. In at least one embodiment, the described configuration of the memory macros 502, 504, 506, 508 implements a neural network. In at least one embodiment, one or more advantages described herein are achievable by the memory device 500A.

Figure 5B:
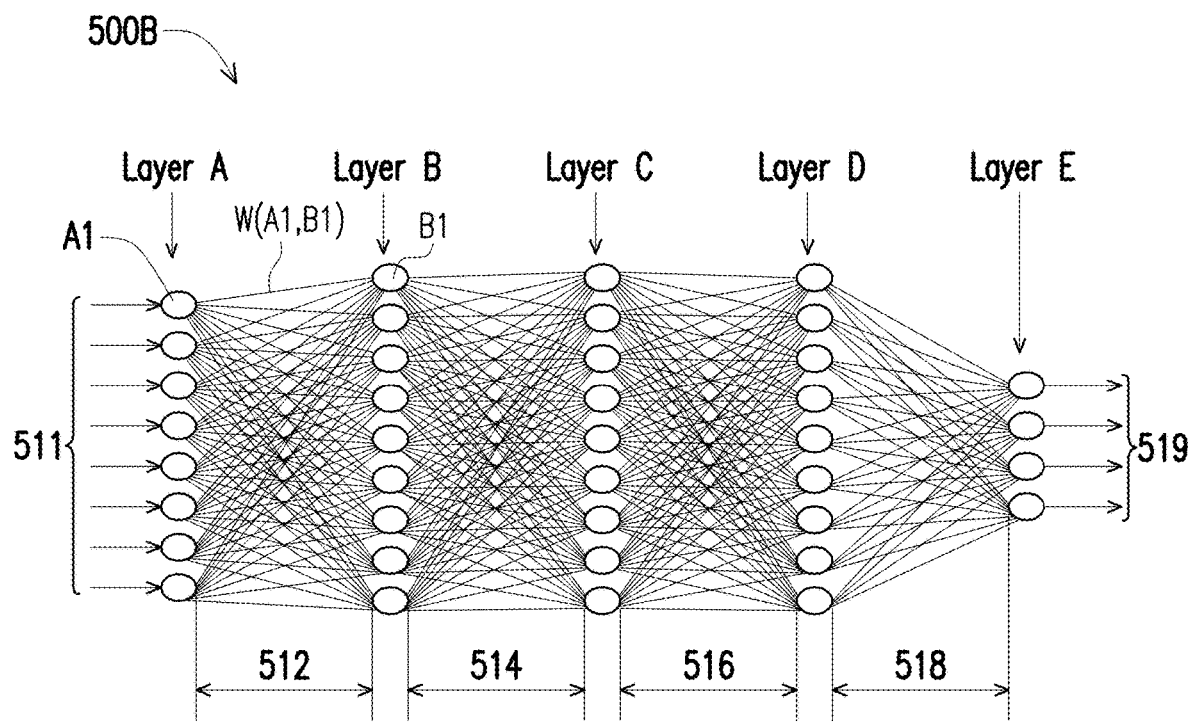
FIG. 5B is a schematic diagram of a neural network, in accordance with some embodiments.

FIG. 5B is a schematic diagram of a neural network 500B, in accordance with some embodiments.

The neural network 500B comprises a plurality of layers A-E each comprising a plurality of nodes (or neurons). The nodes in successive layers of the neural network 500B are connected with each other by a matrix or array of connections. For example, the nodes in layers A and B are connected with each other by connections in a matrix 512, the nodes in layers B and C are connected with each other by connections in a matrix 514, the nodes in layers C and D are connected with each other by connections in a matrix 516, and the nodes in layers D and E are connected with each other by connections in a matrix 518. Layer A is an input layer configured to receive input data 511. The input data 511 propagate through the neural network 500B, from one layer to the next layer via the corresponding matrix of connections between the layers. As the data propagate through the neural network 500B, the data undergo one or more computations, and are output as output data 519 from layer E which is an output layer of the neural network 500B. Layers B, C, D between input layer A and output layer E are sometimes referred to as hidden or intermediate layers. The number of layers, number of matrices of connections, and number of nodes in each layer in FIG. 5B are examples. Other configurations are within the scopes of various embodiments. For example, in at least one embodiment, the neural network 500B includes no hidden layer, and has an input layer connected by one matrix of connections to an output layer. In one or more embodiments, the neural network 500B has one, two, or more than three hidden layers.

In some embodiments, the matrices 512, 514, 516, 518 are correspondingly implemented by the memory macros 502, 504, 506, 508, the input data 511 correspond to the input data DIN, and the output data 519 correspond to the output data DOUT. Specifically, in the matrix 512, a connection between a node in layer A and another node in layer B has a corresponding weight. For example, a connection between node A1 and node B1 has a weight W(A1,B1) which corresponds to a weight value stored in the memory array of the memory macro 502. The memory macros 504, 506, 508 are configured in a similar manner. The weight data in one or more of the memory macros 502, 504, 506, 508 are updated, e.g., by a processor and through the memory controller 520, as machine learning is performed using the neural network 500B. One or more advantages described herein are achievable in the neural network 500B implemented in whole or in part by one or more memory macros and/or memory devices in accordance with some embodiments.

Figure 5C:
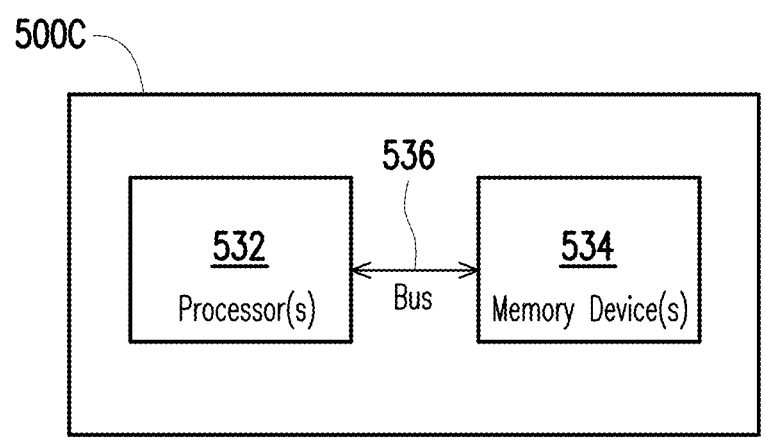
FIG. 5C is a schematic diagram of an integrated circuit (IC) device, in accordance with some embodiments.

FIG. 5C is a schematic diagram of an integrated circuit (IC) device 500C, in accordance with some embodiments.

The IC device 500C comprises one or more hardware processors 532, one or more memory devices 534 coupled to the processors 532 by one or more buses 536. In some embodiments, the IC device 500C comprises one or more further circuits including, but not limited to, cellular transceiver, global positioning system (GPS) receiver, network interface circuitry for one or more of Wi-Fi, USB, Bluetooth, or the like. Examples of the processors 532 include, but are not limited to, a central processing unit (CPU), a multi-core CPU, a neural processing unit (NPU), a graphics processing unit (GPU), a digital signal processor (DSP), a field-programmable gate array (FPGA), an application-specific integrated circuit (ASIC), other programmable logic devices, a multimedia processor, an image signal processors (ISP), or the like. Examples of the memory devices 534 include one or more memory devices and/or memory macros described herein. In at least one embodiment, each of the processors 532 is coupled to a corresponding memory device among the memory devices 534.

In some embodiments, the memory devices 534 are CIM memory devices, and various computations are performed in the memory devices which reduces the computing workload of the corresponding processor 532, reduces memory access time, and improves performance. In at least one embodiment, the IC device 500C is a system-on-a-chip (SOC). In at least one embodiment, one or more advantages described herein are achievable by the IC device 500C.

In some embodiments, a memory device comprises a memory array comprising a plurality of memory cells arranged in a plurality of columns and a plurality of rows. The memory cells in each of the plurality of columns comprise first memory cells and second memory cells alternately arranged along a column direction of the plurality of columns. A first computation circuit coupled to the first memory cells in each of the plurality of columns, and configured to generate first output data corresponding to a first computation performed on first weight data stored in the first memory cells. A second computation circuit coupled to the second memory cells in each of the plurality of columns, and configured to generate second output data corresponding to a second computation performed on second weight data stored in the second memory cells.

In some embodiments, a memory device comprises a memory array and $2^K$ Multiply Accumulate (MAC) circuits. The memory array comprises a plurality of memory cells configured to store weight data for a computing-in-memory (CIM) operation. The plurality of memory cells comprises $2^K$ memory cell groups, where K is a natural number. Each of the $2^K$ memory cell groups comprises at least one row of memory cells. The rows of memory cells of the $2^K$ memory cell groups are alternately arranged along a column direction. Each of the $2^K$ MAC circuits is coupled to the memory cells of a corresponding memory cell group among the $2^K$ memory cell groups, and configured to generate output data corresponding to a computation performed on the weight data stored in the memory cells of the corresponding memory cell group.

In some embodiments, a method of operating a memory device comprises simultaneously accessing adjacent first and second rows of memory cells in the memory device, through a common read word line coupled to the first and second rows of memory cells. The method further comprises performing a first computing-in-memory (CIM) operation using first weight data read from the accessed memory cells of the first row, and a second CIM operation using second weight data read from the accessed memory cells of the second row.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a memory array comprising a plurality of memory cells arranged in a plurality of columns and a plurality of rows, wherein the memory cells in each of the plurality of columns comprise first memory cells and second memory cells alternately arranged along a column direction of the plurality of columns;
    a first computation circuit coupled to the first memory cells in each of the plurality of columns, and configured to generate first output data corresponding to a first computation performed on first weight data stored in the first memory cells; and
    a second computation circuit coupled to the second memory cells in each of the plurality of columns, and configured to generate second output data corresponding to a second computation performed on second weight data stored in the second memory cells,
    wherein in each of the plurality of columns, at least one of the first memory cells is arranged between two of the second memory cells.

2. The memory device of claim 1, further comprising a plurality of word lines, wherein
    the plurality of rows in the memory array comprises first rows of the first memory cells and second rows of the second memory cells,
    the first rows and the second rows are alternately arranged along the column direction, and
    each of the plurality of word lines is coupled to the first memory cells in one of the first rows and the second memory cells in an adjacent one of the second rows.

3. The memory device of claim 1, wherein
    the first computation circuit and the second computation circuit comprise analog Multiply Accumulate (MAC) circuits.

4. The memory device of claim 1, wherein
the first computation circuit and the second computation circuit comprise digital Multiply Accumulate (MAC) circuits.

5. The memory device of claim 1, further comprising a plurality of bit lines including:
first bit lines each coupling the first memory cells in a corresponding column among the plurality of columns to the first computation circuit, and
second bit lines each coupling the second memory cells in a corresponding column among the plurality of columns to the second computation circuit.

6. The memory device of claim 1, further comprising N read word lines and 2N write word lines, where N is a natural number, wherein
the plurality of rows in the memory array comprises N first rows of the first memory cells and N second rows of the second memory cells,
the N first rows and the N second rows are alternately arranged along the column direction,
each of the N read word lines is coupled to the first memory cells in one of the N first rows and the second memory cells in an adjacent one of the N second rows, and
each of the 2N write word lines is coupled either to the first memory cells in one of the N first rows or the second memory cells in one of the N second rows.

7. The memory device of claim 1, further comprising a third computation circuit and a fourth computation circuit, wherein
the memory cells in each of the plurality of columns further comprise third memory cells and fourth memory cells,
the first through fourth memory cells are alternately arranged in each of the plurality of columns,
the third computation circuit is coupled to the third memory cells in each of the plurality of columns, and configured to generate third output data corresponding to a third computation performed on third weight data stored in the third memory cells; and
the fourth computation circuit is coupled to the fourth memory cells in each of the plurality of columns, and configured to generate fourth output data corresponding to a fourth computation performed on fourth weight data stored in the fourth memory cells.

8. The memory device of claim 7, further comprising a plurality of word lines, wherein
the plurality of rows in the memory array comprises first rows of the first memory cells, second rows of the second memory cells, third rows of the third memory cells, and fourth rows of the fourth memory cells,
the first through fourth rows are alternately arranged along the column direction, and
the plurality of word lines comprises:
at least one first word line coupled to the first memory cells in one of the first rows and the second memory cells in an adjacent one of the second rows, and
at least one second word line coupled to the third memory cells in one of the third rows and the fourth memory cells in an adjacent one of the fourth rows.

9. The memory device of claim 8, wherein
the at least one first word line is coupled to the at least one second word line.

10. The memory device of claim 1, wherein
the memory array is arranged, along the column direction, between the first computation circuit and the second computation circuit.

11. A memory device, comprising:
a memory array comprising a plurality of memory cells configured to store weight data for a computing-in-memory (CIM) operation, wherein
the plurality of memory cells comprises $2^K$ memory cell groups, where K is a natural number,
each of the $2^K$ memory cell groups comprises at least one row of memory cells, and
the rows of memory cells of the $2^K$ memory cell groups are alternately arranged along a column direction;
$2^K$ Multiply Accumulate (MAC) circuits each coupled to the memory cells of a corresponding memory cell group among the $2^K$ memory cell groups, and configured to generate output data corresponding to a computation performed on the weight data stored in the memory cells of the corresponding memory cell group; and
a plurality of read word lines each coupled to the memory cells in at least two rows belonging to two different memory cell groups among the $2^K$ memory cell groups.

12. The memory device of claim 11, wherein
at least two rows are adjacent along the column direction.

13. The memory device of claim 11, wherein
a pair of adjacent read word lines among the plurality of read word lines are coupled together.

14. The memory device of claim 11, wherein
the plurality of memory cells of the memory array are arranged in a plurality of columns along the column direction, and
the memory device further comprises, for each of the plurality of columns, $2^K$ read bit lines each coupling the memory cells of one of the $2^K$ memory cell groups to the corresponding MAC circuit.

15. The memory device of claim 14, further comprising:
for each of the plurality of columns, at least one write bit line coupled to the memory cells of all $2^K$ memory cell groups in said column.

16. The memory device of claim 14, further comprising:
a plurality of write word lines each coupled to one corresponding row among the rows of memory cells.

17. A method of operating a memory device, the method comprising:
simultaneously accessing adjacent first and second rows of memory cells in the memory device, through a common read word line coupled to the first and second rows of memory cells; and
performing a first computing-in-memory (CIM) operation using first weight data read from the accessed memory cells of the first row, and a second CIM operation using second weight data read from the accessed memory cells of the second row.

18. The method of claim 17, wherein
the first and second CIM operations are independent from each other.

19. The method of claim 17, wherein
the first and second CIM operations are performed simultaneously.

20. The memory device of claim 1, wherein
the first computation circuit and the second computation circuit are physically arranged at one side of the memory array along the column direction.

* * * * *